United States Patent
Wu et al.

(10) Patent No.: US 7,834,341 B2
(45) Date of Patent: Nov. 16, 2010

(54) PHASE CHANGE MATERIAL (PCM) MEMORY DEVICES WITH BIPOLAR JUNCTION TRANSISTORS AND METHODS FOR MAKING THEREOF

(75) Inventors: Albert Wu, Palo Alto, CA (US);
Chien-Chuan Wei, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 244 days.

(21) Appl. No.: 12/024,986

(22) Filed: Feb. 1, 2008

(65) Prior Publication Data
US 2008/0185570 A1    Aug. 7, 2008

Related U.S. Application Data

(60) Provisional application No. 60/888,139, filed on Feb. 5, 2007.

(51) Int. Cl.
H01L 21/00 (2006.01)
H01L 29/04 (2006.01)
G11C 5/06 (2006.01)

(52) U.S. Cl. .............. 257/4; 257/2; 257/3; 257/5; 257/295; 257/E21.068; 257/E27.004; 257/E45.002; 438/95; 438/96; 438/97

(58) Field of Classification Search .............. 257/2, 257/3, 4, 5, 295, E21.068, E27.004, E45.002; 438/95, 96, 97
See application file for complete search history.

(56) References Cited

U.S. PATENT DOCUMENTS

| 6,597,031 | B2 * | 7/2003 | Kuge ............... 257/295 |
| 7,391,642 | B2 * | 6/2008 | Gordon et al. ....... 365/163 |
| 7,606,056 | B2 * | 10/2009 | Pellizzer et al. ..... 365/63 |

FOREIGN PATENT DOCUMENTS

| EP | 1475840 A1 | 10/2004 |
| EP | 1845567 A1 | 10/2007 |

OTHER PUBLICATIONS

Pellizzer F et al: "A 90mm phase change memory technology for stand-alone non-volatile memory applications" Symposium on VLSI Technology, Jun. 13-15, 2006, Honolulu, HI, USA, 2006, XP002491825 ISBN: 1-4244-0004-X paragraph "PCM cell structure" figures 1-4.

* cited by examiner

*Primary Examiner*—Dao H Nguyen

(57) ABSTRACT

Methods for fabricating highly compact PCM memory devices are described herein. The methods may include forming a bipolar junction transistor (BJT) structure on a substrate including creating a base of the BJT structure on the substrate and creating an emitter of the BJT structure on top of the base opposite of the substrate. A heating element may then be constructed on the emitter of the BJT structure, wherein the heating element includes a material to generate heat when provided with an electrical current from the emitter. A phase change material (PCM) cell may then be built on the heating element opposite of the BJT structure.

17 Claims, 20 Drawing Sheets

PHASE CHANGE MATERIAL (PCM) MEMORY DEVICES WITH BIPOLAR JUNCTION TRANSISTORS AND METHODS FOR MAKING THEREOF

CROSS-REFERENCE TO RELATED APPLICATIONS

The present application claims priority to U.S. Provisional Patent Application No. 60/888,139, filed Feb. 5, 2007, entitled "Process Flow for PCM with BJT," the entire disclosure of which is hereby incorporated by reference in its entirety for all purposes.

TECHNICAL FIELD

Embodiments of the present invention relate to the field of electronic memory devices, and in particular, to phase change material (PCM) memory devices and methods for fabricating thereof.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material (PCM). A PCM is a material that can be placed into at least two physical states, a crystalline state and an amorphous state, by increasing or decreasing temperature. By changing the physical state of the PCM material, certain characteristics of the material, such as electrical resistance, may also change. Such properties may be exploited in order to form memory cells made of PCM (herein "PCM cells").

Such memory cells typically require additional components such as switches and heating elements in order to function as memory cells. The switches are used to drive the heating elements that provide the heat needed by the memory cells in order to change the physical state of the PCM in the memory cells. Unfortunately, because of the presence of these additional components, these memory devices tend to be rather large and they leave relatively large footprints on chip real estate. As a result, so far they have been of limited use as electronic memory devices.

SUMMARY

According to various embodiments of the present invention, novel methods are provided for fabricating highly compact PCM memory devices. The methods may include forming a bipolar junction transistor (BJT) structure on a substrate including creating a base of the BJT structure on the substrate and creating an emitter of the BJT structure on top of the base opposite of the substrate. A heating element may then be constructed on the emitter of the BJT structure, wherein the heating element includes a material to generate heat when provided with an electrical current from the emitter. A phase change material (PCM) cell may then be built on the heating element opposite of the BJT structure.

In some embodiments, constructing the heating element may include constructing the heating element on the emitter so that a center axis of the heating element is the same as a center axis of the BJT structure, the center axis of the BJT structure being a common center axis of the emitter and the base of the BJT structure. For these embodiments building the PCM cell may comprise building the PCM cell on the heating element so that a center axis of the PCM cell is not aligned with the center axis of the heating element. In alternative embodiments, however, the PCM cell may be built on the heating element so that a center axis of the PCM cell is the same as the center axis of the heating element.

In some embodiments, the BJT structure may be formed within oxide layers. For these embodiments, the construction of the heating element may comprise etching back the emitter of the BJT to remove a portion of the emitter in order to form a void, and constructing the heating element within the void. An electrical contact may be formed at a bottom of the void on a surface of the etched back emitter, and the constructing of the heating element may include constructing the heating element on top of the electrical contact.

In some embodiments, the heating element may be constructed within the void by growing a spacer within the void, depositing heating element material at least on top of the grown spacer to form a ring-type heating element having a heating hole, and depositing an oxide into the heating hole to fill the heating hole with the oxide. For these embodiments, the heating element material may be comprised of at least one of TiN and TaN.

In some embodiments, the construction of the heating element may include deposition of a heating element material into the void created by the etch back operation to fill the void with the heating element material forming a block-type heating element, the block-type heating element without a hole. For these embodiments, the heating element material comprises Tungsten.

In some embodiments, building of the PCM cell may include building an electrode on the PCM cell. For these embodiments, the method may further include capping the PCM cell and the electrode with an oxide layer, and forming a via in the oxide layer that is coupled to the electrode. A metal 1 (M1) layer may be patterned on the oxide layer including coupling the patterned M1 layer to the via. In some embodiments, forming of the BJT structure may include creating an n-type base on the substrate and creating a p-type emitter on the n-type base.

According to various embodiments of the present invention, an apparatus is provided comprising a bipolar junction transistor (BJT) structure, a ring-type heating element, and a PCM cell. In particular, the BJT structure has a base disposed on top of a substrate, and an emitter disposed on top of the base opposite of the substrate. The ring-type heating element is disposed on the emitter of the BJT structure, wherein the heating element includes a material to generate heat when provided with an electrical current from the emitter. The PCM cell is disposed on the heating element opposite of the BJT structure.

In some embodiments, the ring-type heating element may have a heating hole filled with an oxide. For these embodiments, the heating element may have a center axis that is the same as a center axis of the BJT structure, the center axis of the BJT structure being a common center axis of the emitter and the base of the BJT structure. In some embodiments, the PCM cell may have a center axis that is not aligned with the center axis of the heating element. In some embodiments, the BJT structure may have an n-type base and a p-type emitter disposed on top of the n-type base.

According to some alternative embodiments, an apparatus is provided that comprises a BJT structure, a block-type heating element, and a PCM cell. For these embodiments, the BJT structure has a base disposed on top of a substrate, and an emitter disposed on top of the base opposite of the substrate. The block-type heating element is disposed on the emitter of the BJT structure and includes a material to generate heat when provided with an electrical current from the emitter. The PCM cell is disposed on the heating element opposite of the BJT structure.

In some embodiments, the block-type heating element is without a hole. For these embodiments, the heating element may have a center axis that is the same as a center axis of the BJT structure, the center axis of the BJT structure being a common center axis of the emitter and the base of the BJT structure. In some embodiments, the PCM cell may have a center axis that is the same as the center axis of the heating element. In some embodiments, the BJT structure may include an n-type base and a p-type emitter disposed on top of the n-type base.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," "some embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

According to various embodiments of the present invention, fabrication processes are provided for forming one or more PCM memory devices on substrate structures, the resulting PCM memory devices being highly compact and having stacked structures that leave relatively small footprints on chip real estate. These PCM memory devices may include a PCM cell coupled to a heating element, and a BJT coupled to the heating element to supply electrical current to the heating element. These and other aspects of various embodiments of the present invention will be described in greater detail in the following description.

Figure 1:
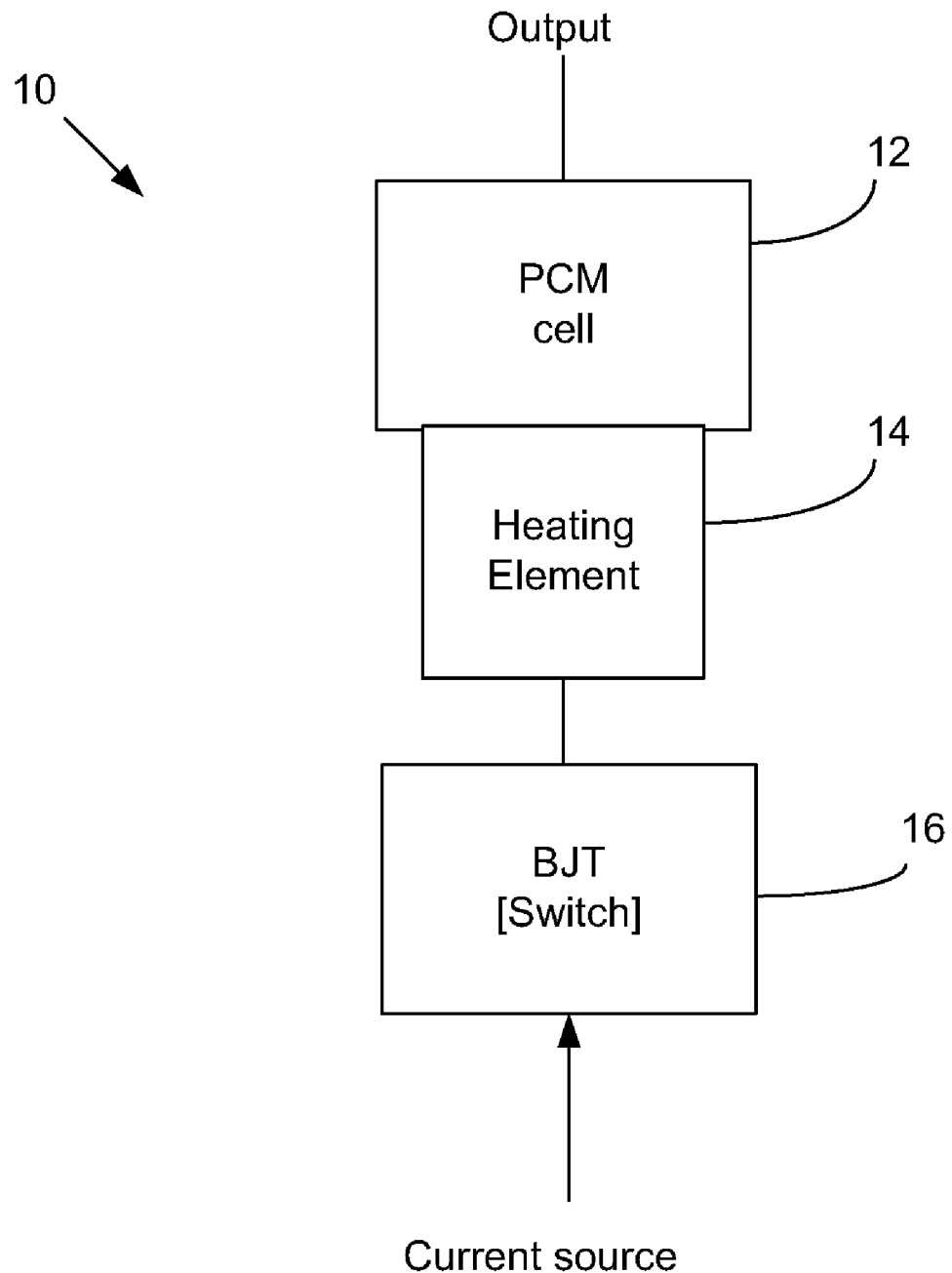
FIG. 1 illustrates a stacked PCM memory device, in accordance with various embodiments of the present invention.

Referring to FIG. 1, which illustrates a stacked PCM memory device in accordance with various embodiments of the present invention. The PCM memory device 10 includes a PCM cell 12, a heating element 14, and a BJT 16. In some embodiments, the PCM cell 12 may be employed as a memory cell in a memory device. The PCM cell 12 may be comprised of a phase change material that can transition at least between two different physical states (e.g., crystalline and amorphous). Examples of such materials include, for example, GeTe, GeSbTe, and so forth. For the embodiments, the BJT 16 may be a PNP-type BJT (or an NPN-type BJT) used as a switch for supplying electrical current to the heating element 14, which when supplied with the electrical current, heats at least a portion of the PCM cell 10.

In the following, processes for fabricating two stacked PCM memory devices on a substrate will be described. Note that these same processes, however, may also be employed in alternative embodiments in order to fabricate a single stacked PCM memory device or three or more stacked PCM memory devices on a substrate. The words "building," "constructing," "forming," "creating," and "fabricating" as used throughout the following description may be used interchangeably and are, therefore, synonymous unless otherwise indicated.

Figure 2:
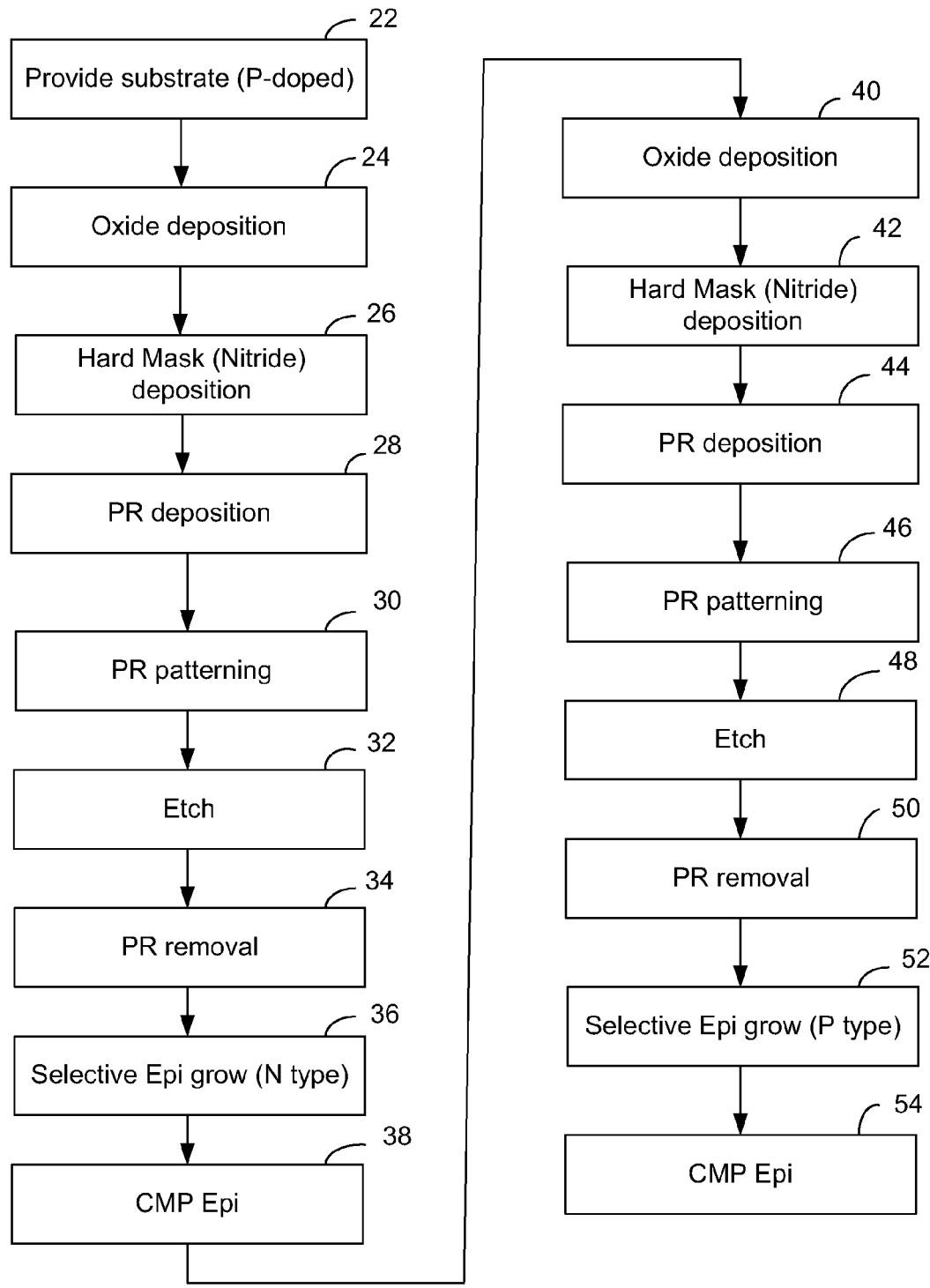
FIG. 2 is a flow chart describing a process for forming bipolar junction transistors (BJTs), in accordance with various embodiments of the present invention.
Figure 3:
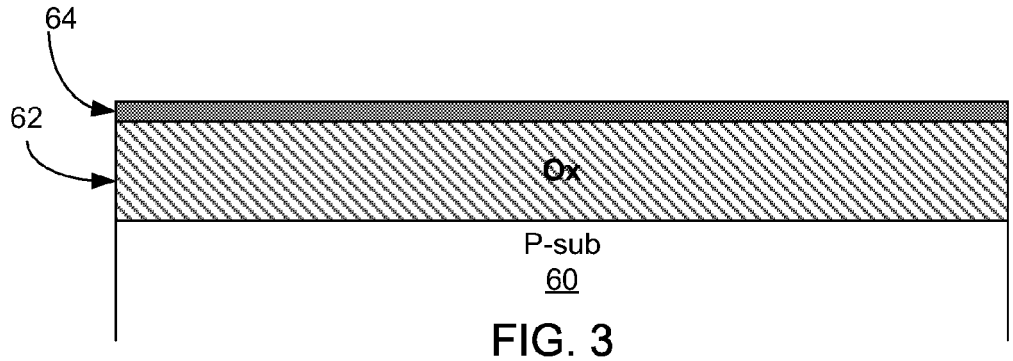
FIGS. 3 to 13 illustrate a substrate structure after different stages of the process of FIG. 2, in accordance with various embodiments of the present invention.
Figure 35:
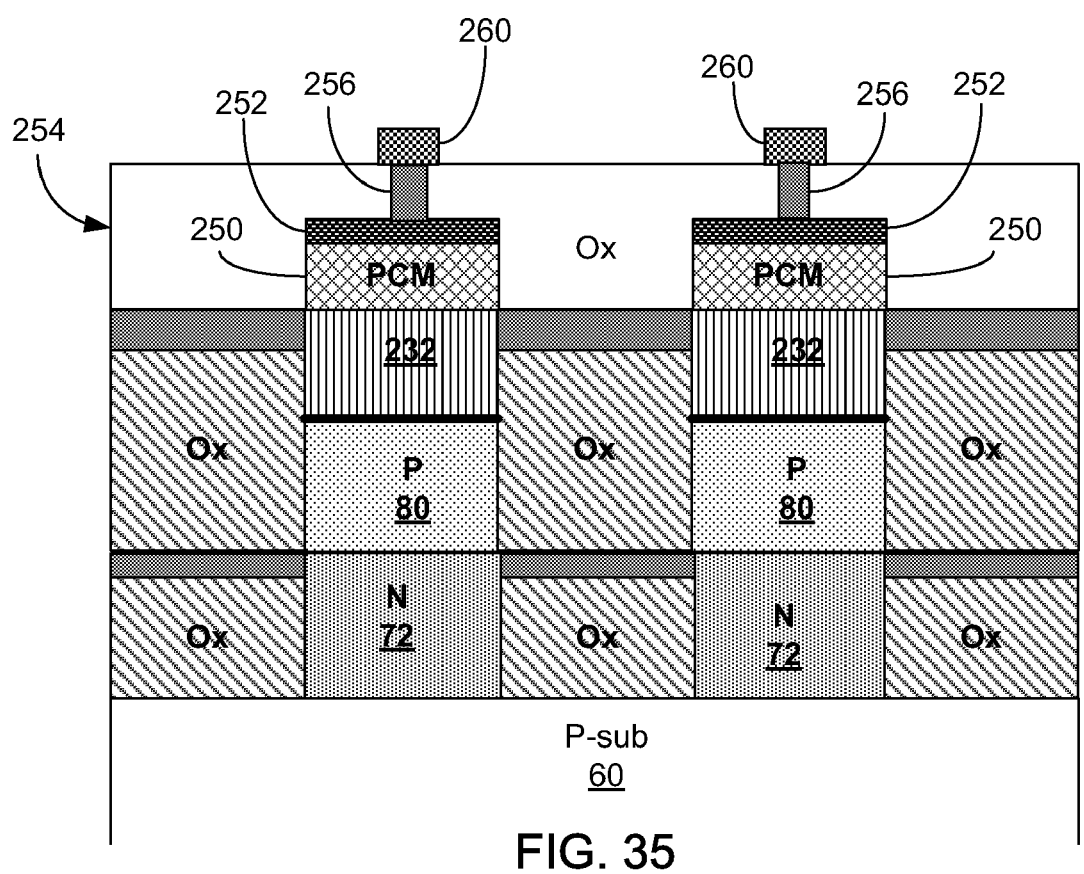
Figure 36:
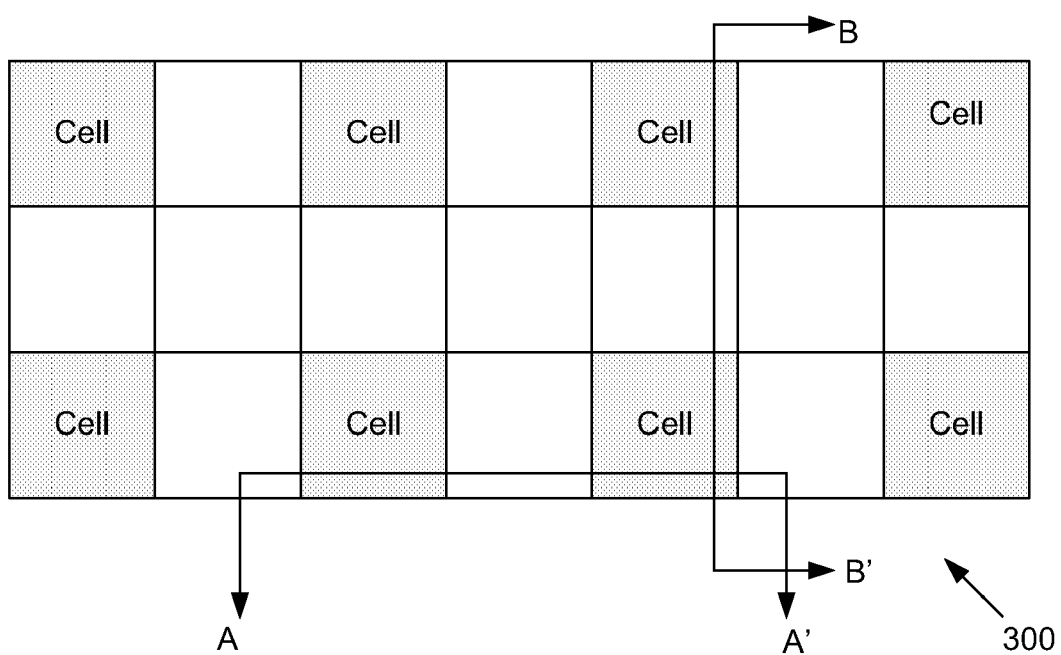
FIG. 36 illustrates a top down view of an array of memory cells, in accordance with various embodiments of the present invention.

Referring now to FIG. 2 a process for forming two PNP-type BJT structures on a substrate in accordance with various embodiments of the present invention may be described. In some embodiments, the process 20 may be employed in combination with process 100 of FIG. 14 or process 200 of FIG. 26 in order to form the memory cells of the array of memory cells 300 illustrated in FIG. 36 (FIG. 36 depicts a plan view of an array of memory cells). The process 20 will be described with additional reference to FIGS. 3 to 13, which are generally side views of a substrate structure at different stages of the process 20. More particularly, FIGS. 3 to 13 (as well as FIGS. 15 to 25 and 26 to 35) are generally side views of a substrate being processed to form the two memory cells depicted in FIG. 36 (i.e., AA' or BB' perspectives of FIG. 36). The process 20 may begin when a P-doped silicon substrate ("P-substrate" or "P-sub") is provided at block 22. In some embodiments, the P-substrate may be disposed on top of another substrate. A first oxide layer may then be formed on top of the P-sub via oxide deposition at block 24. A layer of a first hard mask may then be deposited onto the oxide layer opposite of the P-sub at block 26. The first hard mask (or simply "HM") may, in some instances, be a first Nitride HM. FIG. 3 depicts the resulting substrate structure comprising the P-substrate 60, the first oxide layer 62, and the first HM 64.

Figure 4:
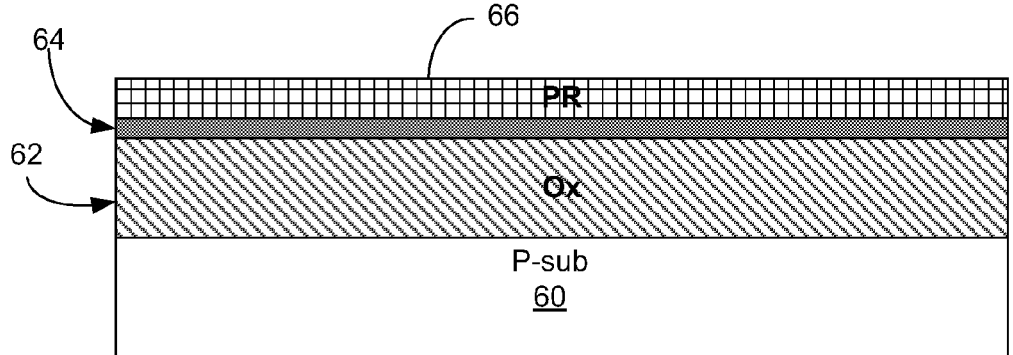
Figure 5A:
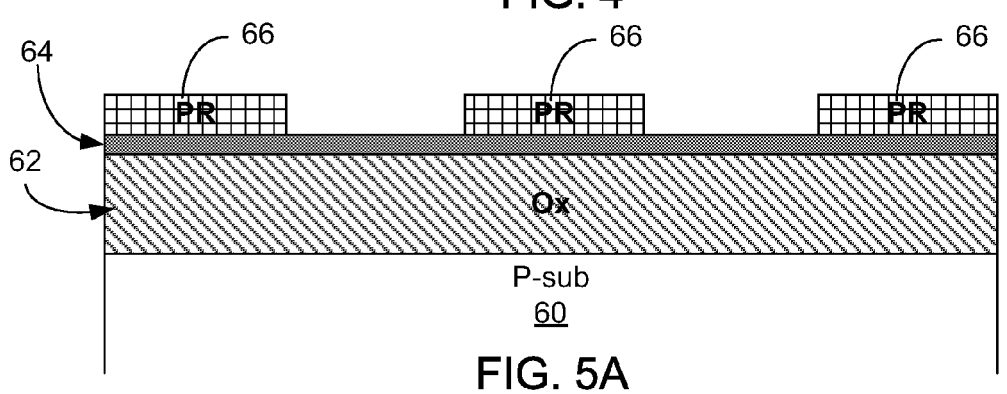
Figure 5B:
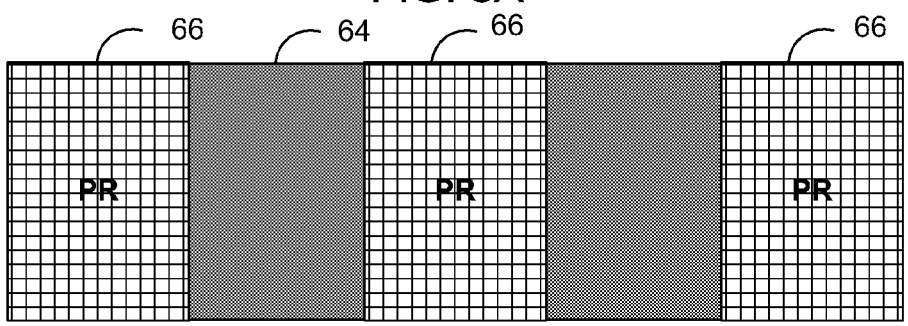
Figure 6:
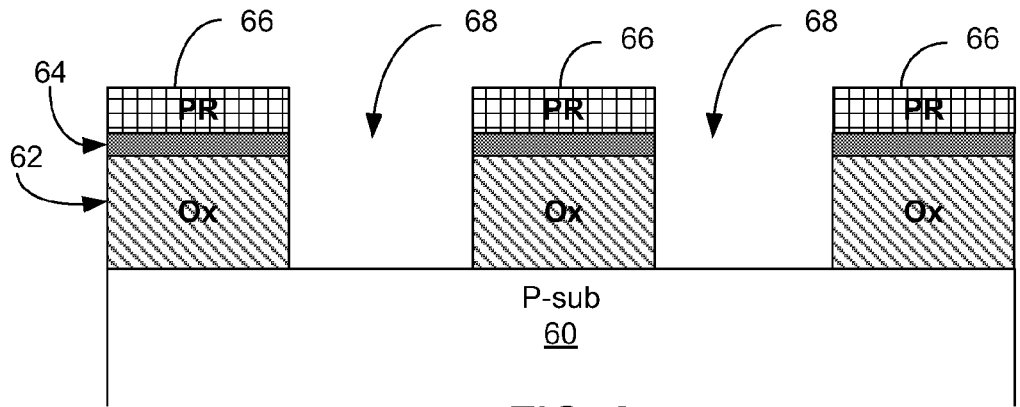
Figure 7:
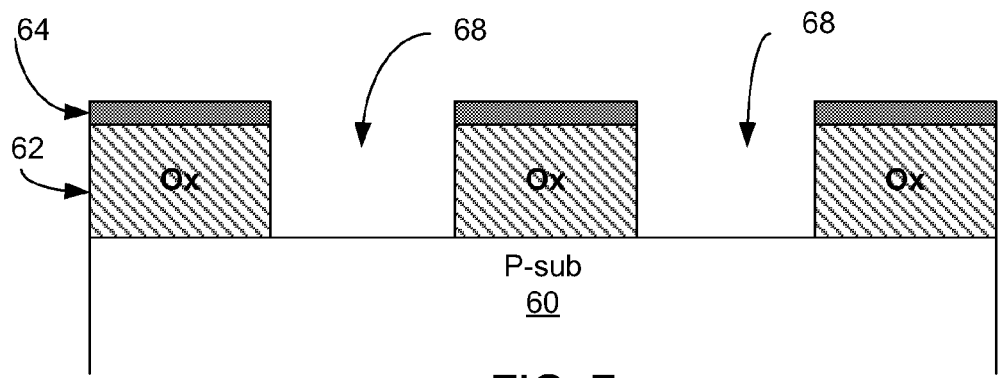
Figure 8:
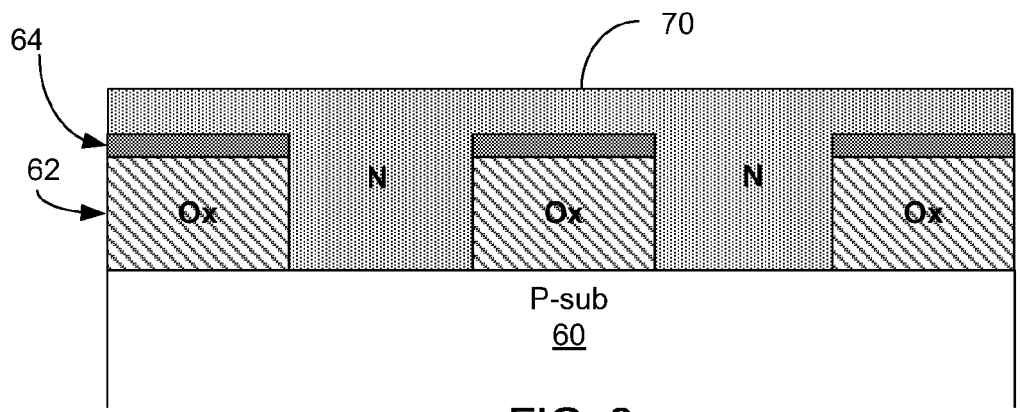
Figure 9:
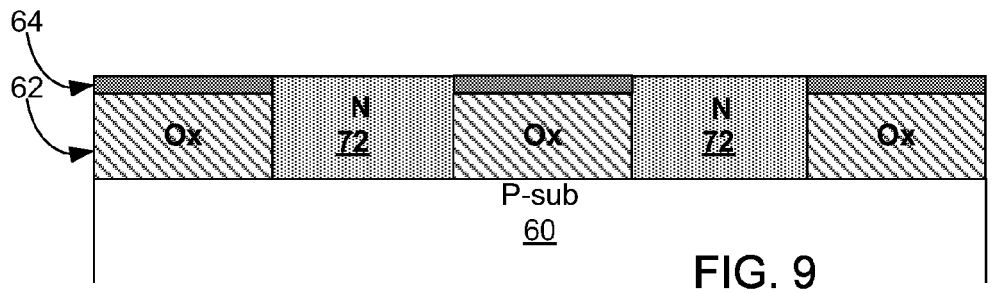

A layer of photoresist (PR) 66 may then be deposited onto the first HM 64 at block 28 as depicted in FIG. 4. The PR 66 may then be patterned at block 30 as depicted in FIG. 5A (FIG. 5B depicts the top down view of the PR 66 and HM 64 of FIG. 5B). Next, an etching operation at block 32 may be performed as depicted in FIG. 6 in order to create voids where the bases of the BJTs may be subsequently created. The etching operation may remove the portions of the first HM 64 and the first oxide layer 62 not protected or covered by the patterned PR 66. As a result, voids 68 are formed. The patterned PR 66 may then be removed at block 34 as depicted in FIG. 7. Next, a selective n-type epitaxy (epi) grow may be performed at block 36 that results in the voids 68 being filled with n-type epi 70 as depicted in FIG. 8. The n-type epi 70 may also cover the first HM 64. A chemical-mechanical-polish (CMP) operation may be performed at block 38 in order to remove the excess epi 70 above the first HM 64 as depicted in FIG. 9. As a result, two n-type bases 72 are formed for the two BJT structures that are to be fabricated.

Figure 10A:
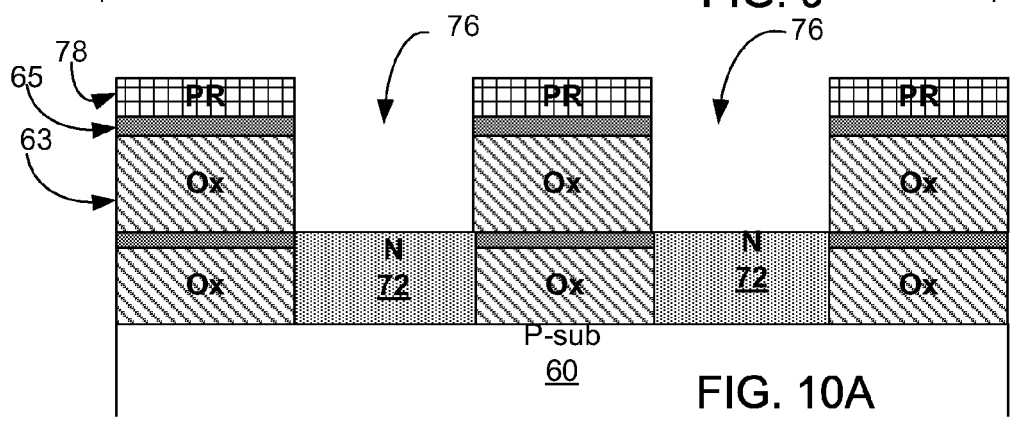
Figure 10B:
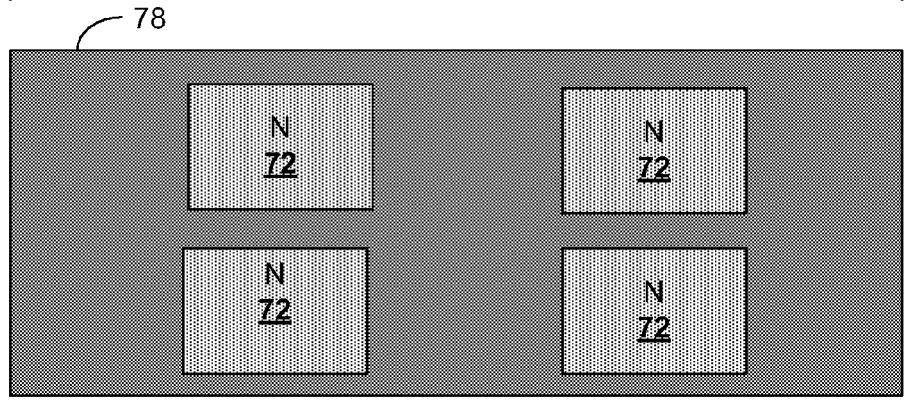
Figure 11:
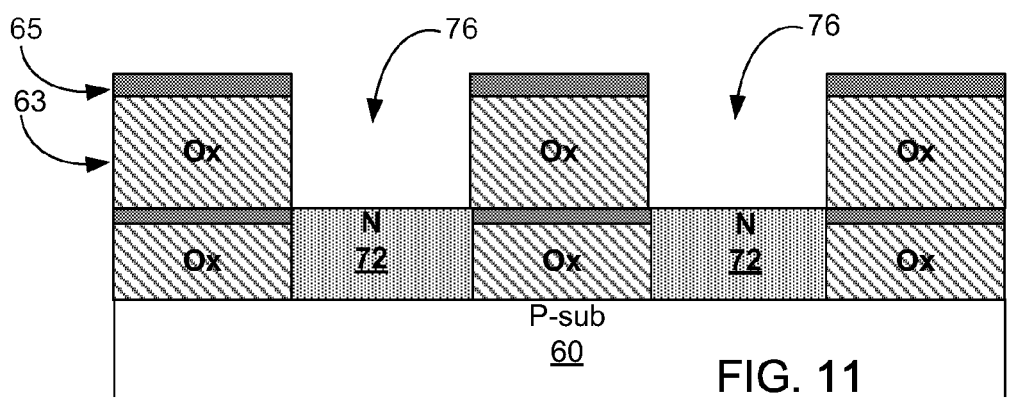

Next, the p-type emitters for the two BJT structures to be constructed may be formed. In order to do so, voids 76 above the N-type bases 72 may be created by performing an oxide deposition operation at block 40, an HM deposition operation at block 42, a PR deposition operation at block 44, a PR patterning operation at block 46, and an etching operation at block 48. Blocks 40, 42, 44, 46, and 48 corresponds to and mirror blocks 24, 26, 28, 30, and 32, and will therefore, not be further described. The resulting substrate structure is depicted in FIG. 10A, which includes a second oxide layer 63, a second HM 65, a patterned PR 78, and voids 76 where the p-type emitters for the BJT structures to be constructed may be created. FIG. 10B depicts a top down view of the pattern PR 78 of FIG. 10A. FIG. 10B also depicts the two n-type bases 72 along with additional n-type bases 72 that may have been similarly formed. The patterned PR 78 may then be removed at block 50 as depicted in FIG. 11.

Figure 12:
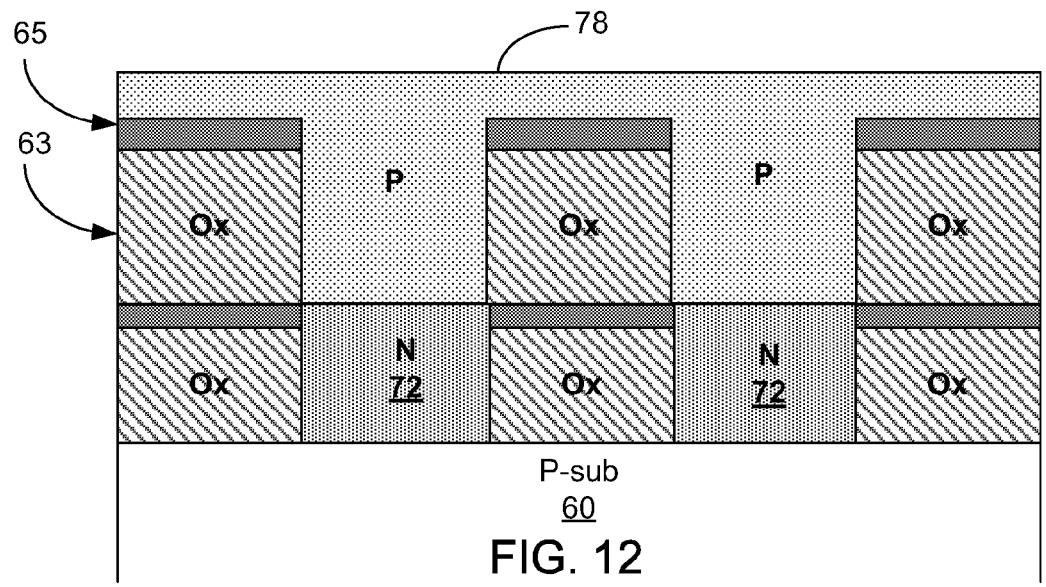
Figure 13:
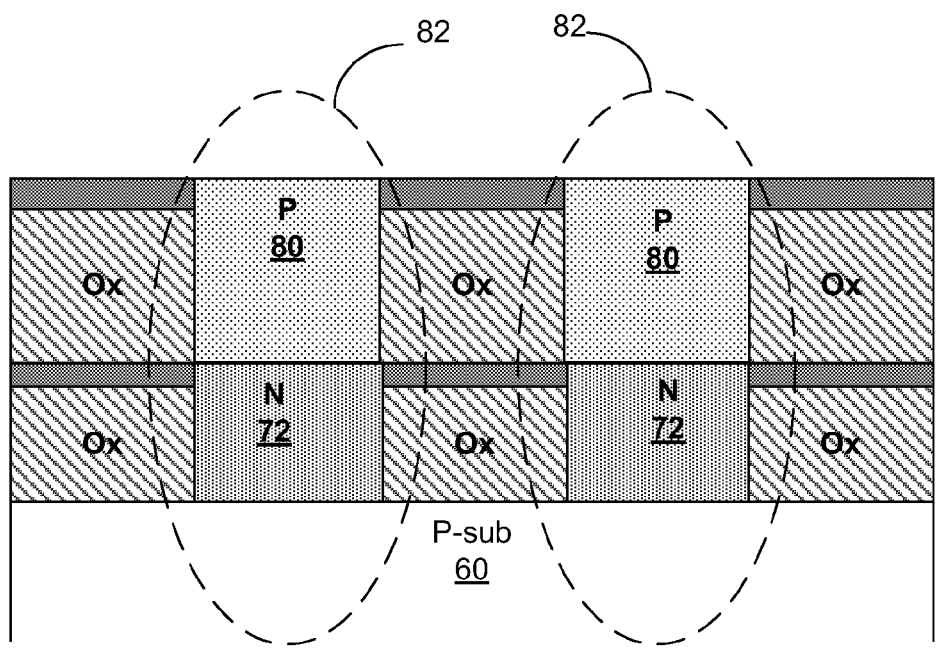

A selective p-type epitaxy (epi) grow operation may then be performed at block 52 that results in the voids 76 being filled with p-type epi 78 as depicted in FIG. 12. The resulting p-type epi 78 may also cover the second HM 65. To remove the excess p-type epi formed on top of the second HM 65, a CMP operation may be performed at block 54. The resulting substrate structure is depicted in FIG. 13, which includes two PNP-type BJT structures 82. The two PNP-type BJT structures 82 include p-type emitters 80, n-type bases 72, and p-type collectors (i.e., the P-substrate 60). Although the process 20 is for forming PNP-type BJT structures, in alternative embodiments, the process 20 may be slightly modified in order to form NPN-type BJT structures rather than PNP-type BJT structures. For example, NPN-type BJT structures may be formed by replacing the starting P-substrate with an N-substrate, replacing the n-type epi used in block 36 with a p-type epi, and so forth.

Once the BJT structures 82 have been constructed, at least two alternative processes may be employed in order to construct and stack heating elements and PCM cells onto the BJT structures 82 of FIG. 13. As will be further described, in a first process, ring-type heating elements may be constructed and stacked onto the BJT structures 82, while in a second process a block-type heating element may be constructed and stacked onto the BJT structures 82.

Figure 14:
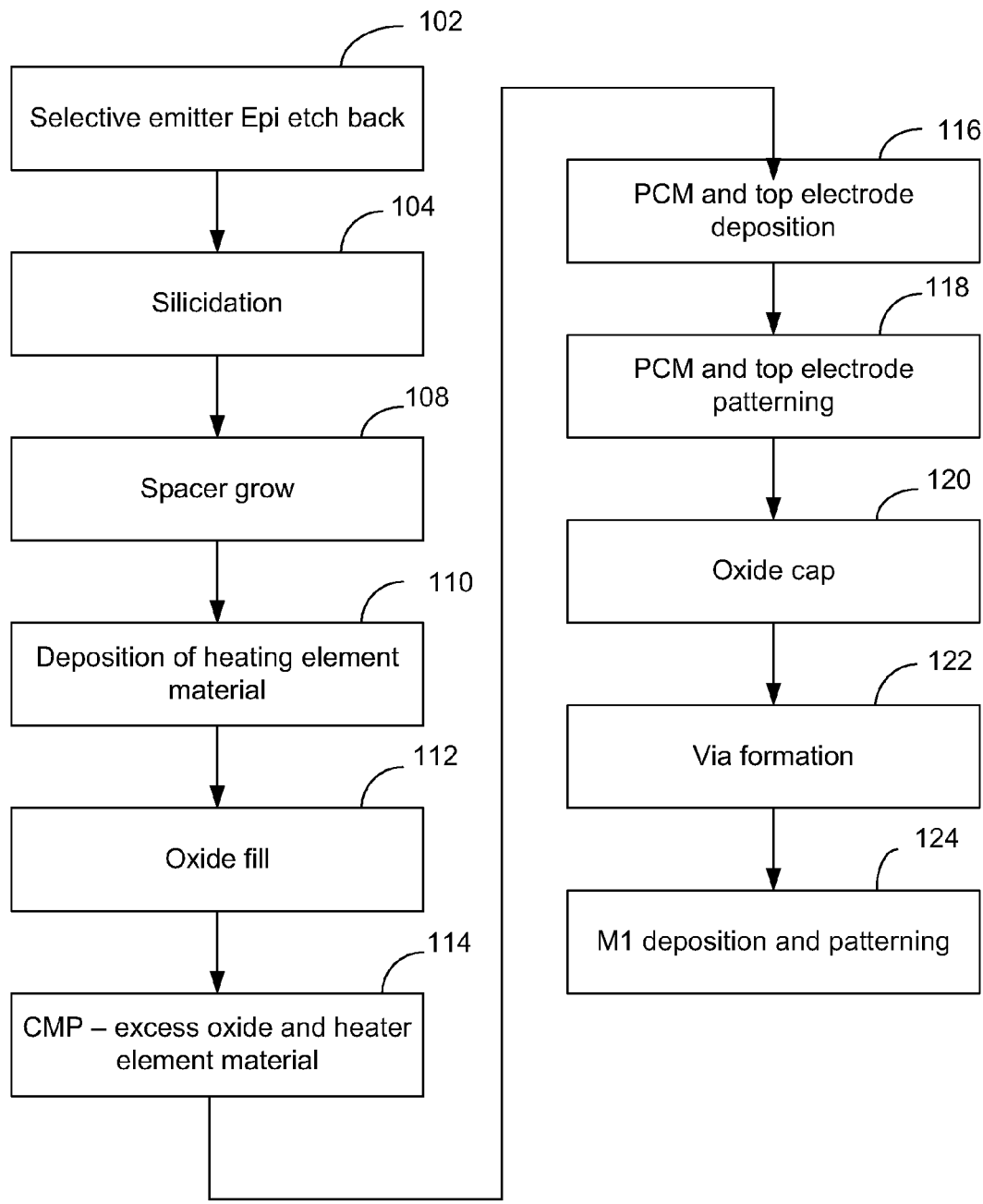
FIG. 14 is a flow chart describing a process for forming ring-type heating elements on BJT structures, and for forming and coupling PCM cells to the ring-type heating elements, in accordance with various embodiments of the present invention.
Figure 15:
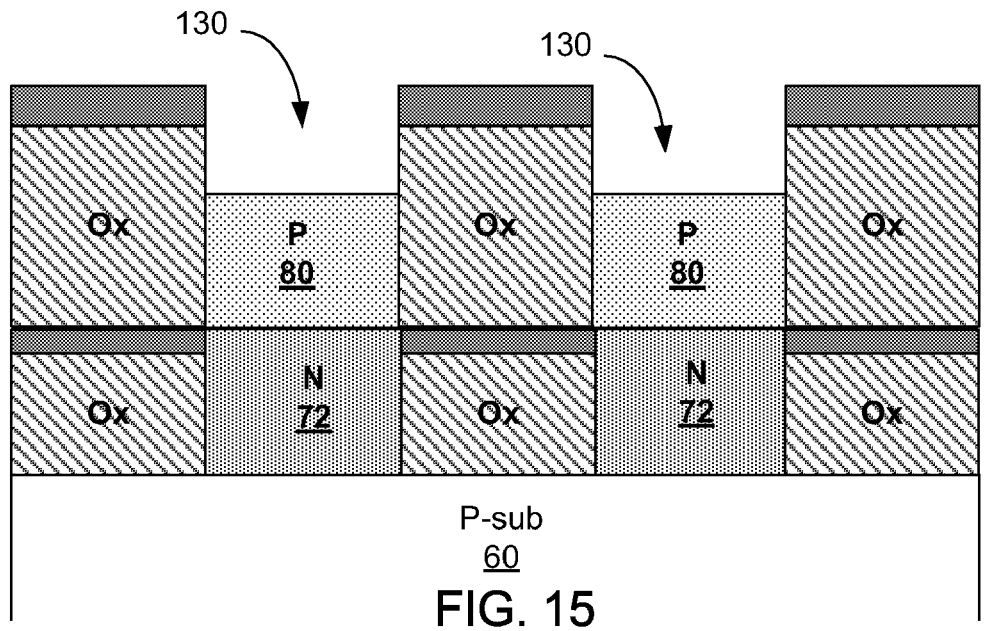
FIGS. 15 to 25 illustrate a substrate structure after different stages of the process of FIG. 14, in accordance with various embodiments of the present invention.

FIG. 14 is a process for constructing and stacking ring-type heating elements onto BJT structures, and for building and coupling PCM cells to the ring-type heating elements in accordance with various embodiments of the present invention. In some embodiments, the process 100 may be implemented using the BJT structures 82 of FIG. 13. The process 100 may begin at block 102 when a selective etch back operation is performed on emitters 80 of the BJT structures 82 to remove at least the top portions of the emitters 80 as depicted in FIG. 15. As a result, voids 130 may be formed where the ring-type heating elements may be subsequently constructed.

Figure 16:
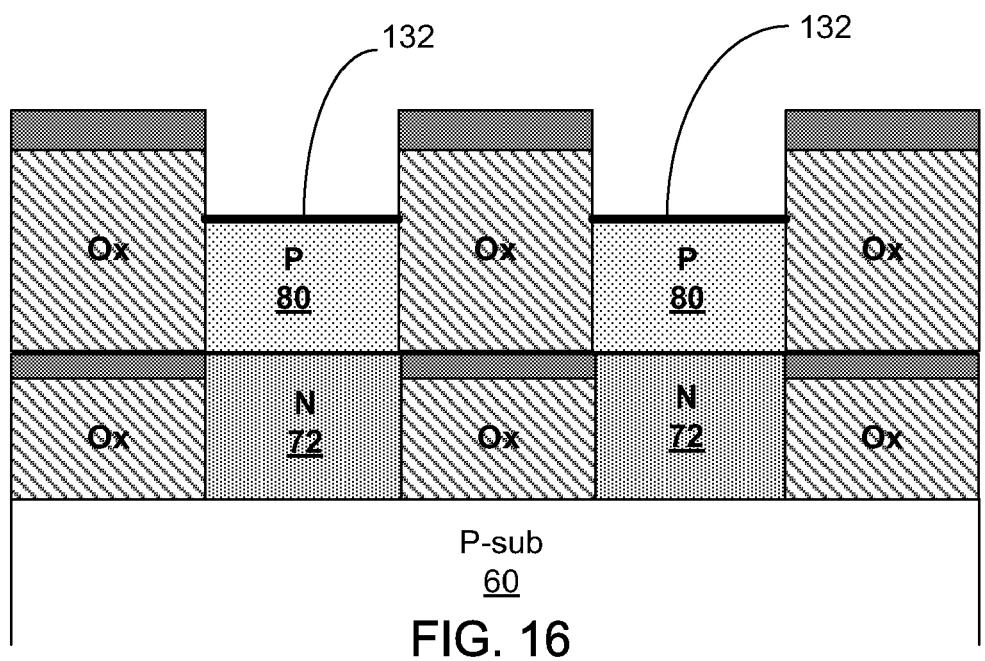
Figure 17:
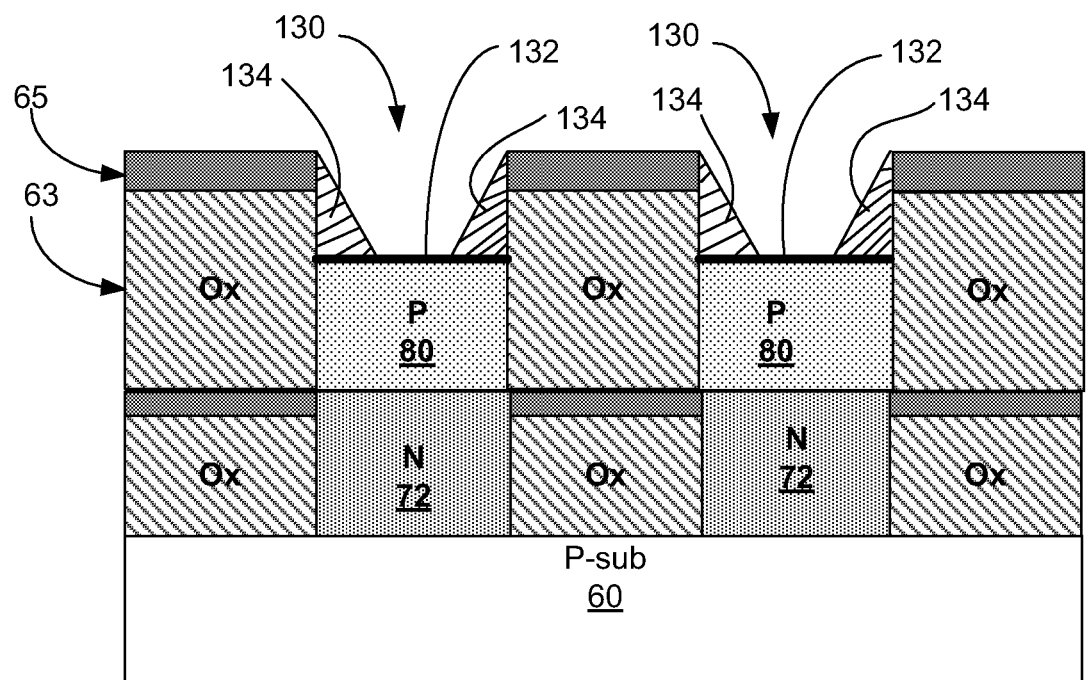

A silicidation operation may be performed at block 104 in order to form silicide layers ("silicides") 132 at the bottom of the voids 130 and on the top surfaces of the emitters 80 as depicted in FIG. 16. The formed silicides 132 may be conductive and may act as electrical contacts for the emitters 80 and the ring-type heating elements to be constructed on top of the silicides 132. Next, a spacer grow operation may be performed at block 108, which results in spacers 134 forming within the voids 130 on top of the silicides 132 and up against the second oxide layer 63 and the second HM 65. Note that the spacers 134 have wide bases and are tapered towards the openings of the voids 130.

Figure 18:
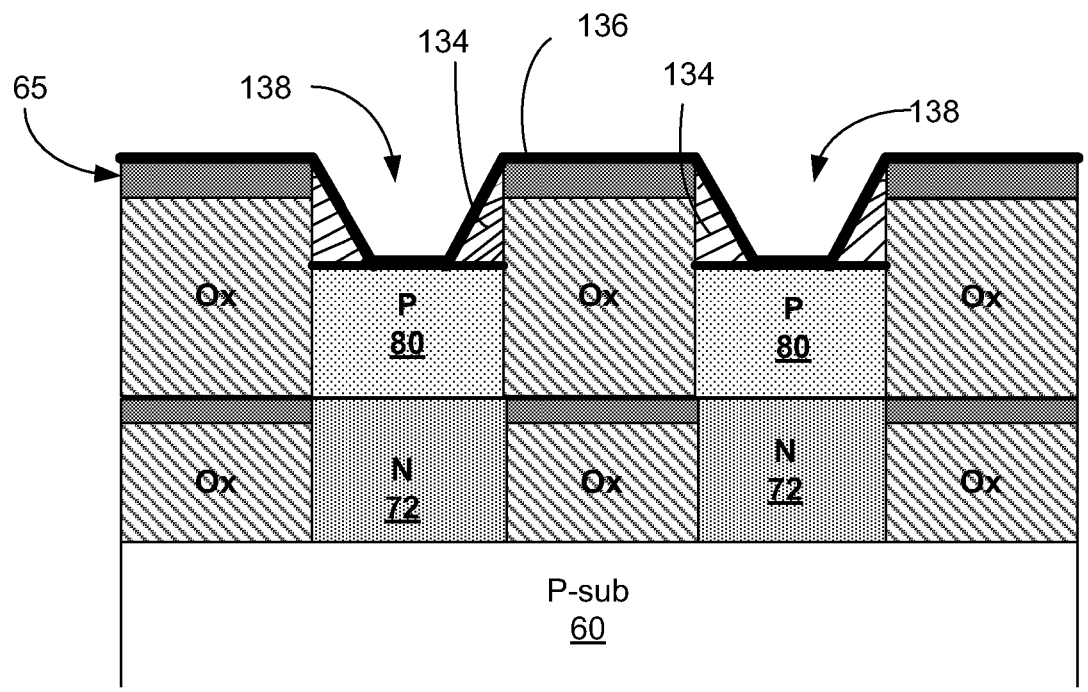
Figure 19:
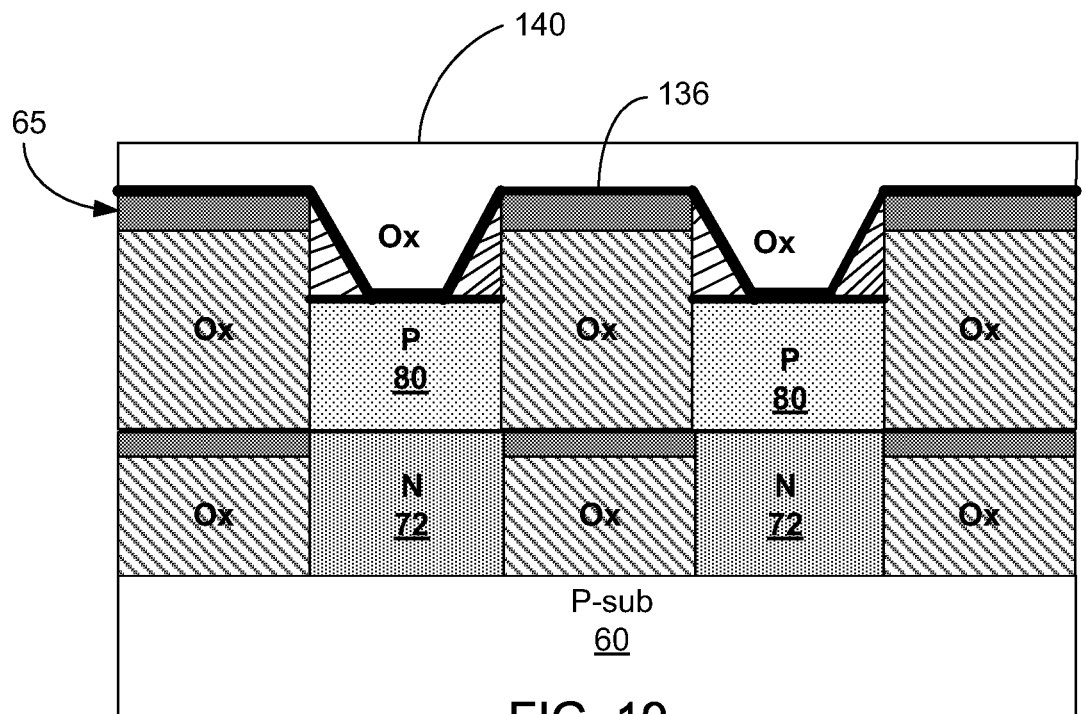
Figure 20:
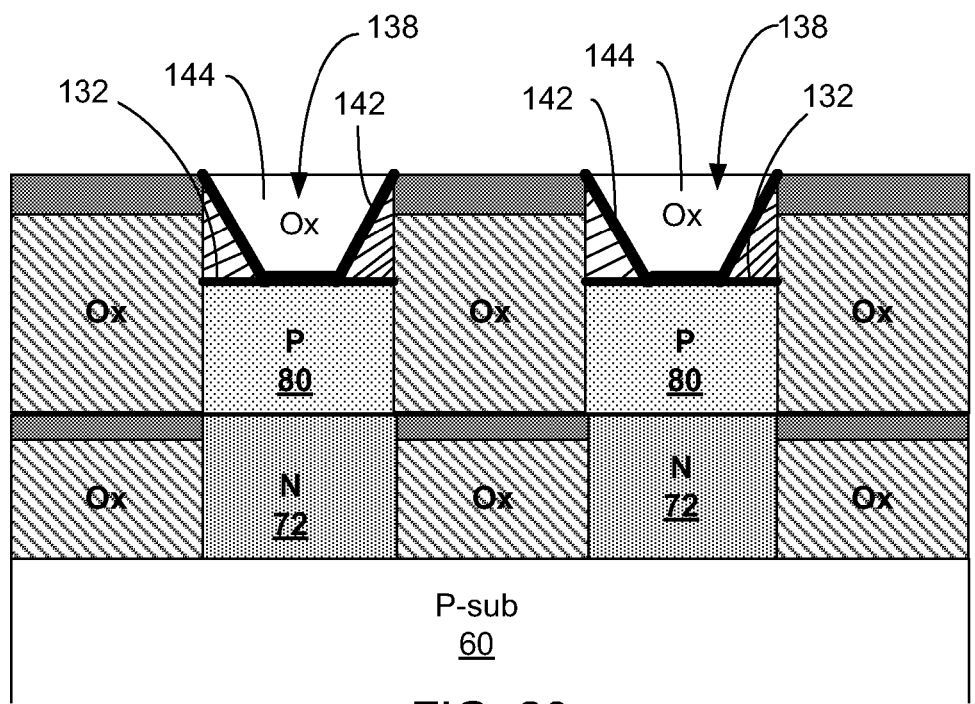

Deposition of heating element material may then be performed at block 110 that results in a heating element material layer 136 being formed on top of the second HM 65, the spacers 134, and the silicides 132 as depicted in FIG. 18. The heating element material layer 136 may be comprised of material that may generate heat when electrical current is applied to the material such as, for example, TiN, TaN, and so forth. After the heating element material layer 136 has been deposited, heater holes 138 may be formed. An oxide fill operation may be performed at block 112 in order to fill the heater holes 138 with an oxide 140 or other thermally insulating material as depicted in FIG. 19. Excess oxide 140 and excess heating element material layer 136 on top of the second HM 65 may be removed by a CMP operation at block 114. The resulting substrate structure is depicted in FIG. 20. In particular, FIG. 20 shows two ring-type heating elements 142 mounted directly above and coupled to the silicides (i.e., contacts) 132, which are further coupled to the p-type emitters of the BJT structures 82. The ring-type heating elements 142 include the heater holes 138 that are filled with oxides 144.

Figure 21:
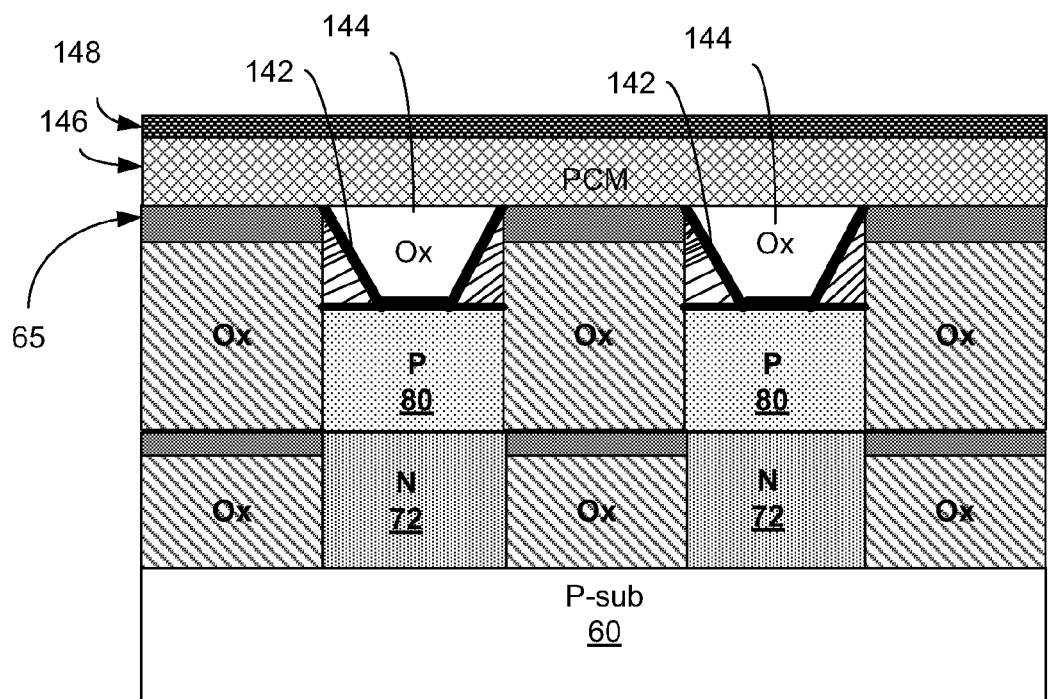

Deposition of PCM and top electrode layers may then be performed at block 116. The resulting substrate structure is depicted in FIG. 21. In particular, FIG. 21 depicts a PCM layer 146 being on top of the ring-type heating elements 142, the oxides 144, and the second HM 65, and the top electrode layer 148 being on top of the PCM layer 146. In various embodiments, the PCM layer 146 may be comprised of GeTe, GeSbTe, and so forth.

Figure 22:
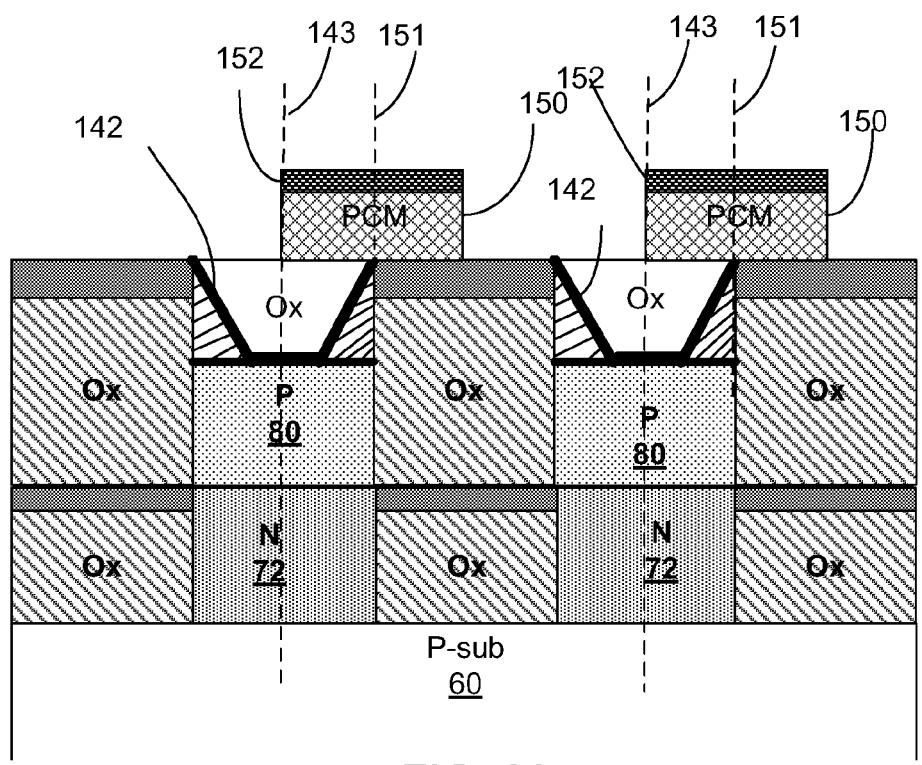

The PCM layer 146 and the top electrode layer 148 may then be patterned at block 118 to form PCM cells 150 and top electrodes 152 as depicted in FIG. 22. Although not depicted, the PCM cells 150 and the top electrodes 152, if viewed from above the substrate structure of FIG. 22, may have a rectangular, a circular, or any other shape type. Note that PCM cells 150 are offset from the ring-type heating elements 142. That is, although the center axes 143 of the ring-type heating elements 142 may be the same as the center axes 143 of their respective BJT structures 82 (i.e., the common axes of the emitters 80 and bases 72), the center axis 151 of the PCM cells 150 may not align with the center axes 143 of their respective ring-type heating elements 142. This may advantageously allow for more efficient heating of the PCM cells 150. That is, when heating elements 142 are driven by the emitters 80 of the BJT structures 82, the central portions of the PCM cells 150 may be advantageously heated first before external portions of the PCM cells 150 are heated. Thus, FIG. 22 illustrates two stacked PCM memory devices with ring-type heating elements 142 in accordance with various embodiments.

Figure 23:
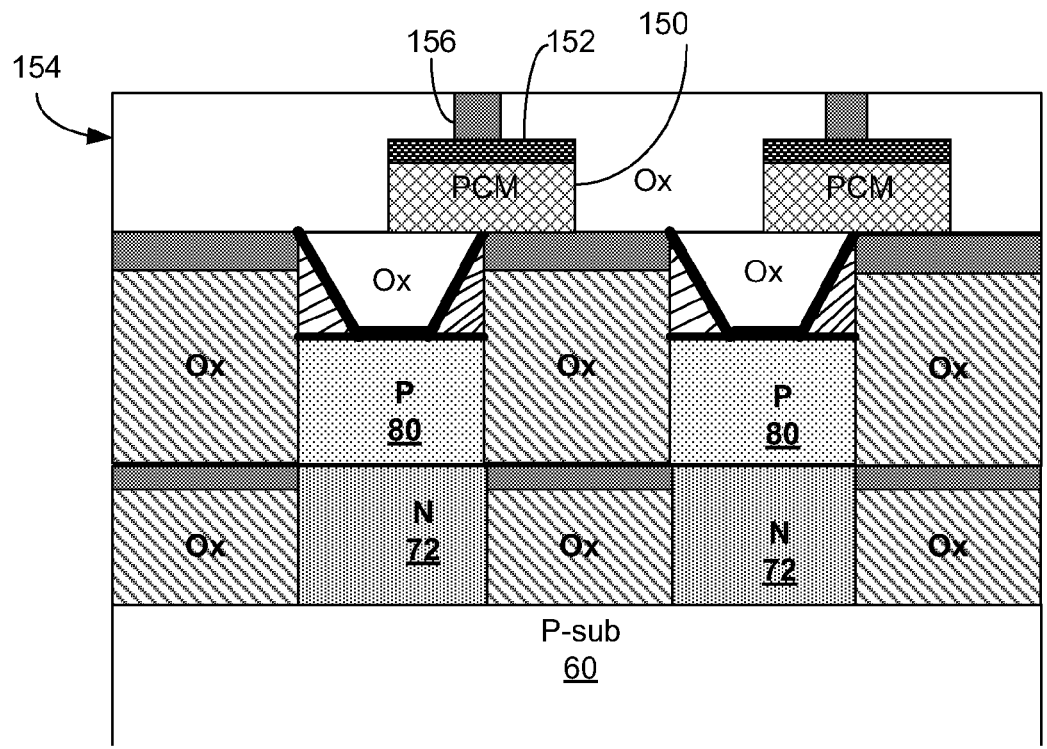
Figure 24:
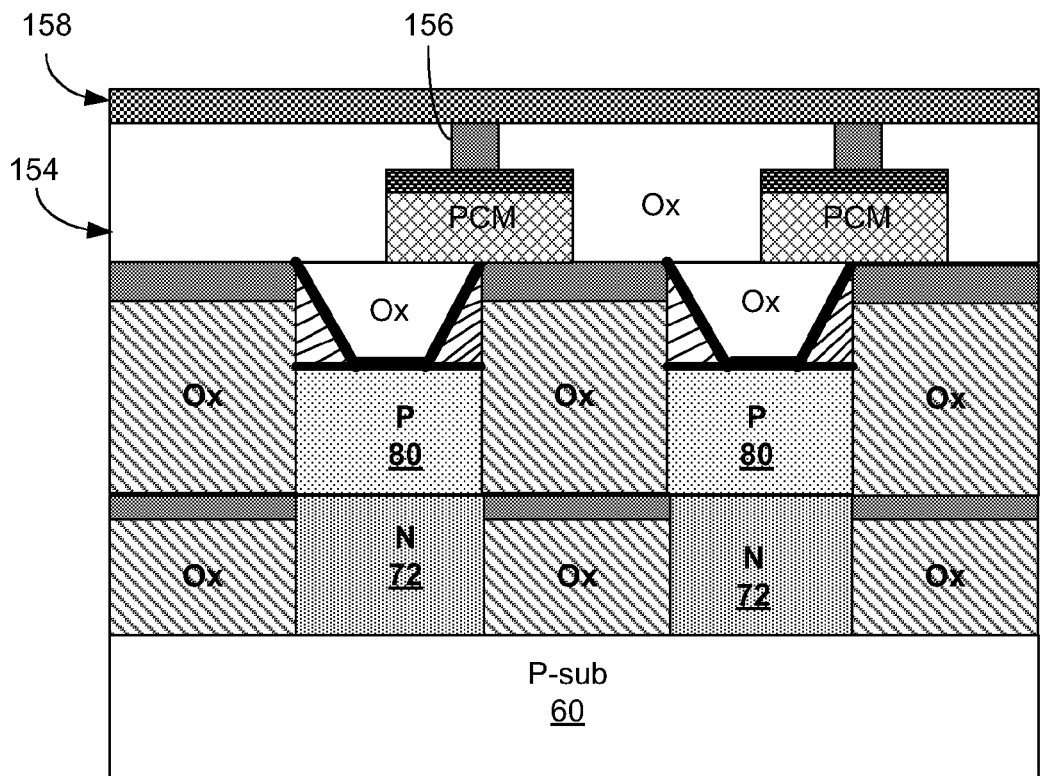
Figure 25:
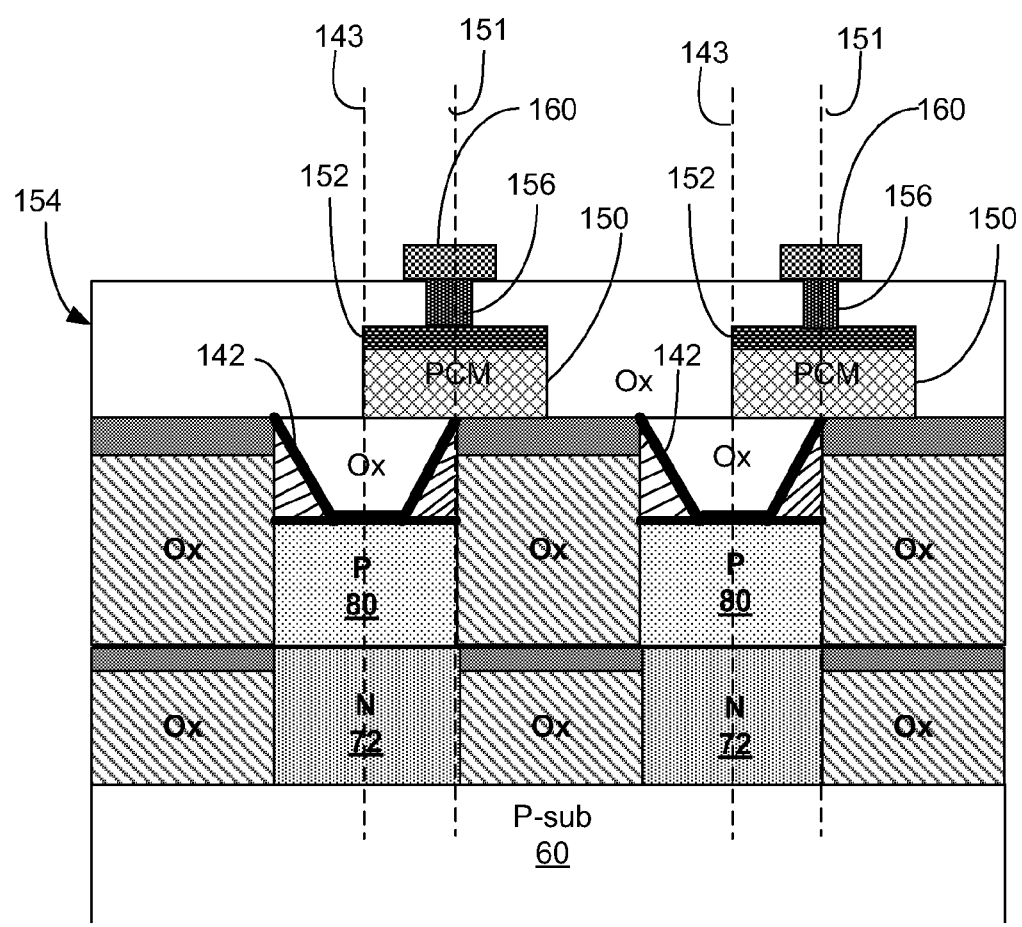

An oxide cap operation may further be performed at block 120 in order to deposit an oxide cap layer 154 over the top electrodes 152 and the PCM cells 150 as depicted in FIG. 23. A via formation operation may then be performed on the oxide cap layer 154 at block 122 in order to create vias 156 in the oxide cap layer 154 and on top of the top electrodes 152. A metal one (M1) layer deposition operation may then be performed at block 124 that results in an M1 layer 158 being deposited on the oxide cap layer 154 as depicted in FIG. 24. Finally, the M1 layer 158 may be patterned to form patterned M1 layer 160 as depicted in FIG. 25. In some embodiments, the patterned M1 layer 160 may be bit lines of a memory device. As illustrated in FIG. 25, the center axis 151 of the patterned M1 layer 160 (e.g., bit lines) is substantially aligned with the center axis 151 of the PCM cells 150. In other words, the patterned M1 layer 160 (e.q., bit lines) shares a common center axis 151 with the PCM cells 150.

Figure 26:
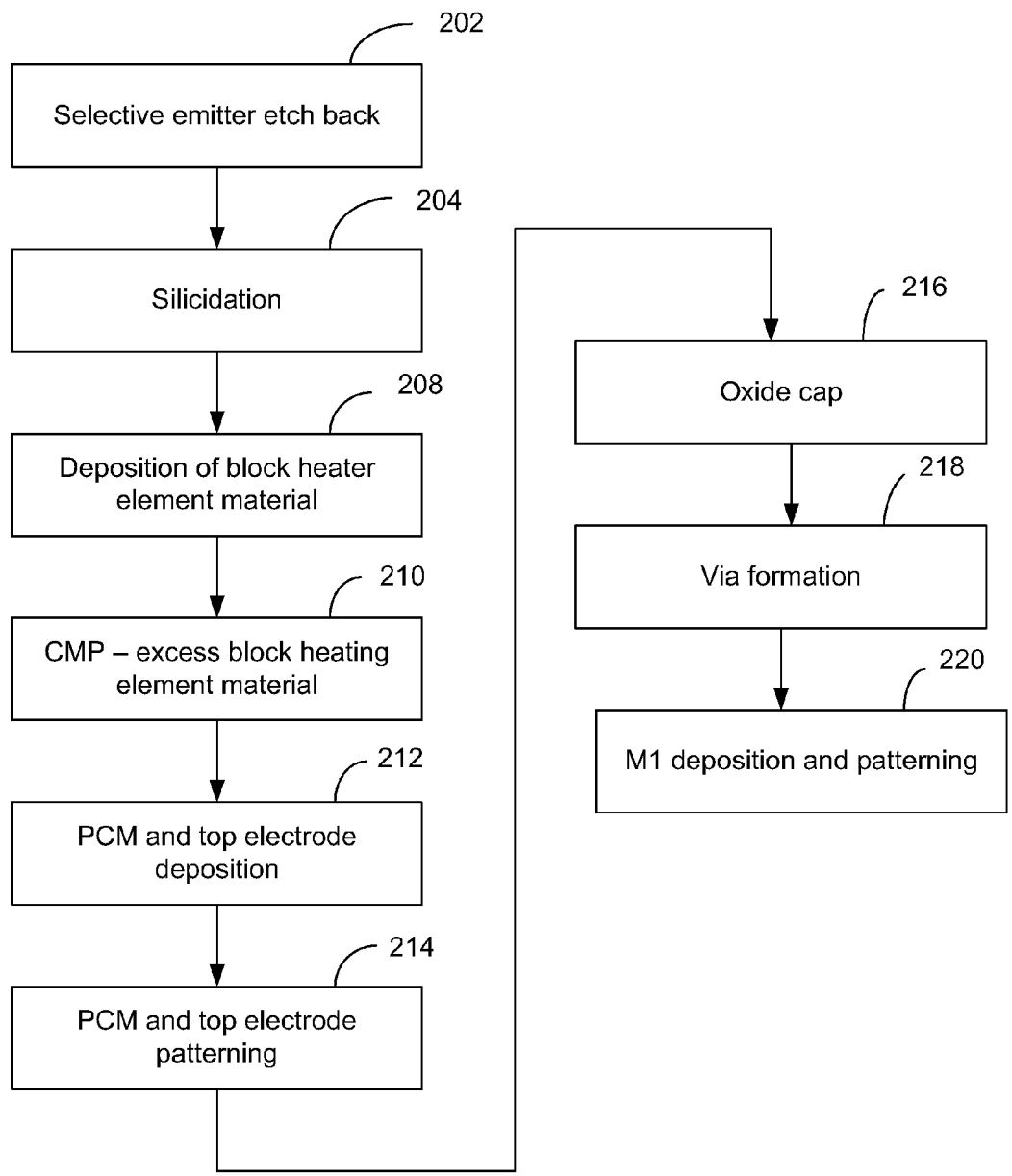
FIG. 26 is a flow chart describing a process for forming block-type heating elements on BJT structures, and for forming and coupling PCM cells to the ring-type heating elements, in accordance with various embodiments of the present invention.
Figure 27:
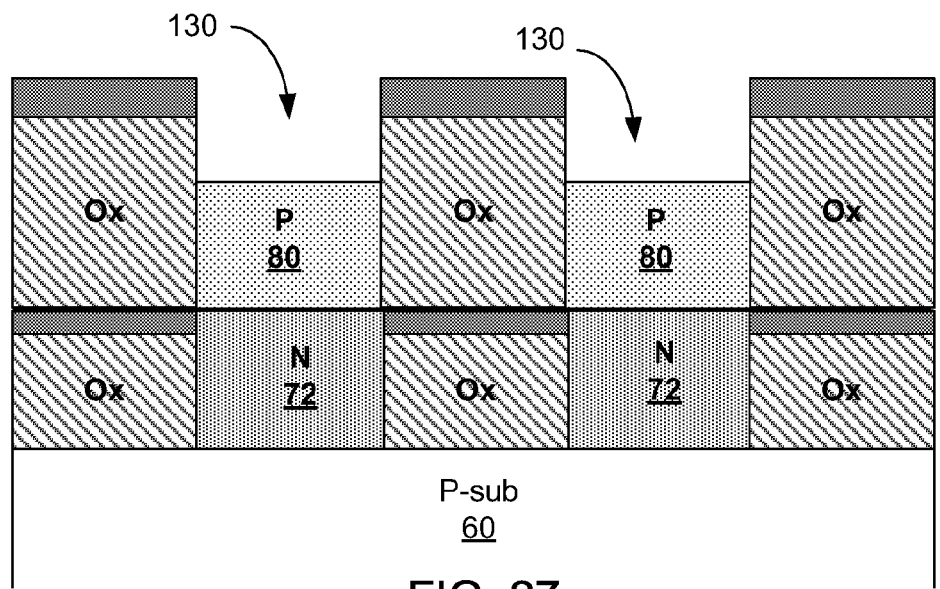
FIGS. 27 to 35 illustrate a substrate structure after different stages of the process of FIG. 26, in accordance with various embodiments of the present invention.

FIG. 26 is an alternative process for constructing and stacking block-type heating elements onto BJT structures, and for building and coupling PCM cells to the block-type heating elements in accordance with various embodiments of the present invention. In some embodiments, the process 200 may be implemented using the BJT structures 82 of FIG. 13. The process 200 may begin at block 202 when a selective etch back operation may be performed on emitters 80 of the BJT structures 82 to remove at least the top portions of the emitters 80 as depicted in FIG. 27. As a result, voids 130 may be formed where the block-type heating elements may be subsequently constructed.

Figure 28:
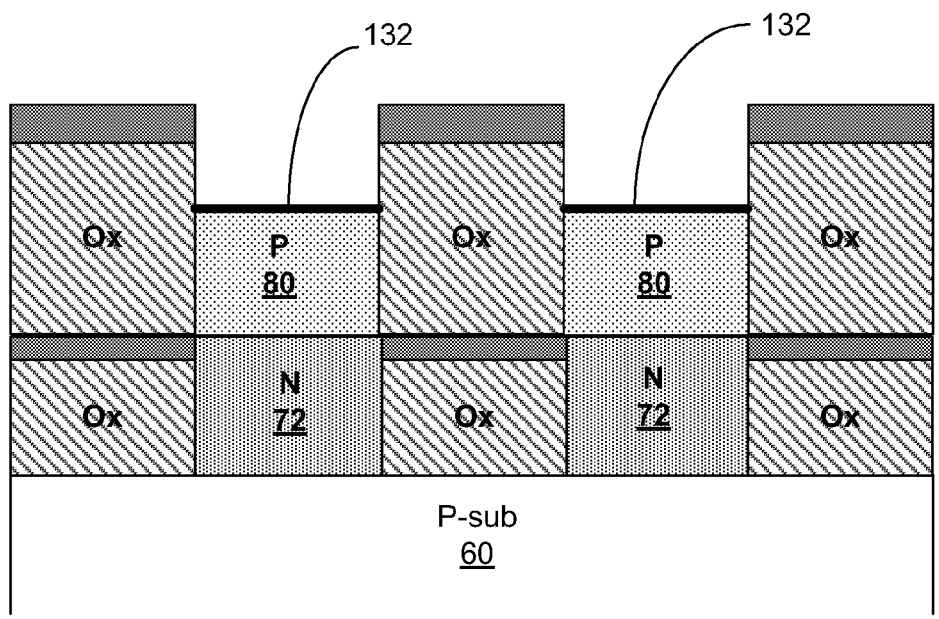

A silicidation operation may be performed at block 204 in order to form silicide layers ("silicides") 132 at the bottom of the voids 130 and on the top surfaces of the emitters 80 as depicted in FIG. 28. The formed silicides 132 may be conductive and may act as electrical contacts for the emitters 80 and the ring-type heating elements to be constructed on top of the silicides 132.

Figure 29:
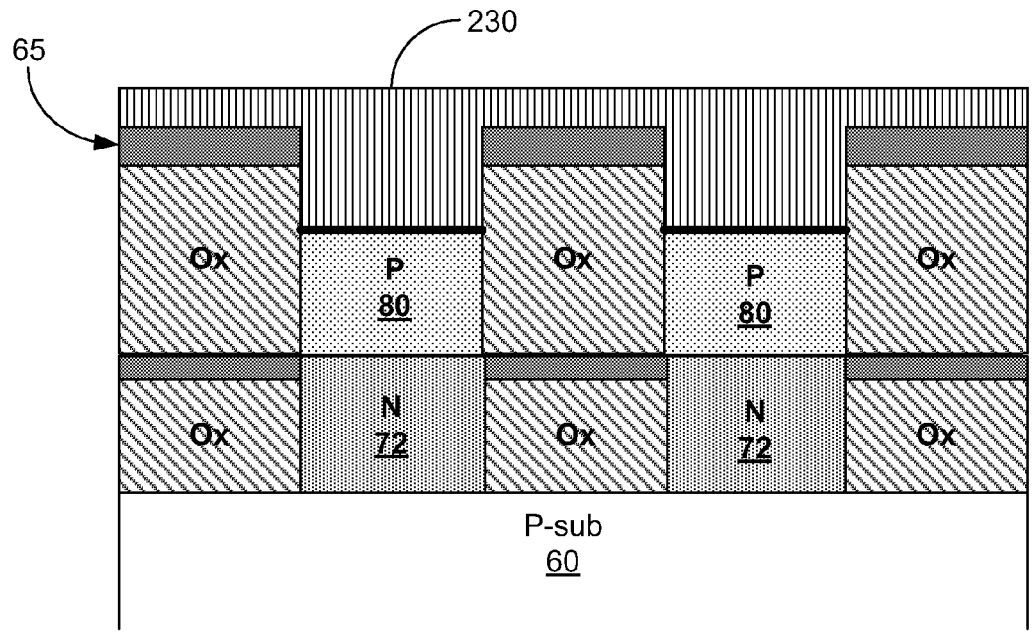
Figure 30:
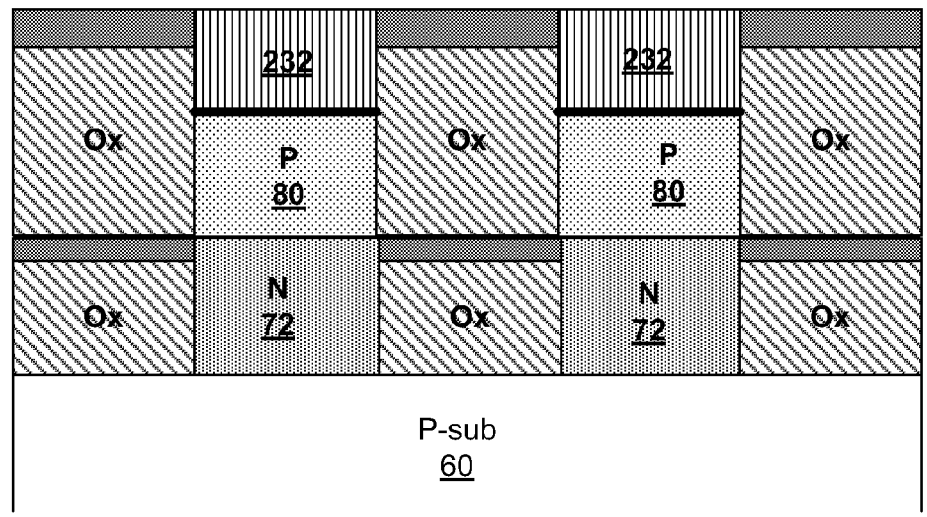

Block heating element material 230 may then be deposited at block 208 to fill the voids 130 as depicted in FIG. 29. As further depicted, the block heating element material 230 may also be deposited on top of and above the second HM 65. In some embodiments, the block heating element material 230 may be comprised of Tungsten, or other types of heating element material that generated heat in response to an electrical current. A CMP operation may then be performed at block 210 to remove the excess block heating element material 230 above the second HM 65. As result, block-type heating elements 232 without holes or voids may be formed on top of the silicides 132 as depicted in FIG. 30.

Figure 31:
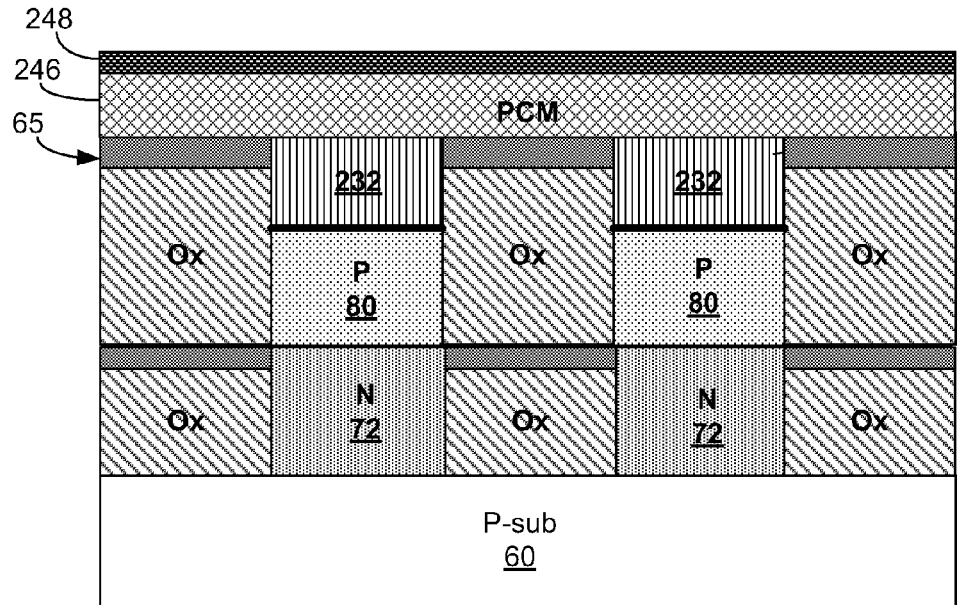

Deposition of PCM and top electrode layers may then be performed at block 212. The resulting substrate structure is depicted in FIG. 31. In particular, FIG. 31 depicts a PCM layer 246 being on top of the block-type heating elements 232 and the second HM 65, and the top electrode layer 248 on top of the PCM layer 246. In various embodiments, the PCM layer may be comprised of GeTe, GeSbTe, and so forth.

Figure 32:
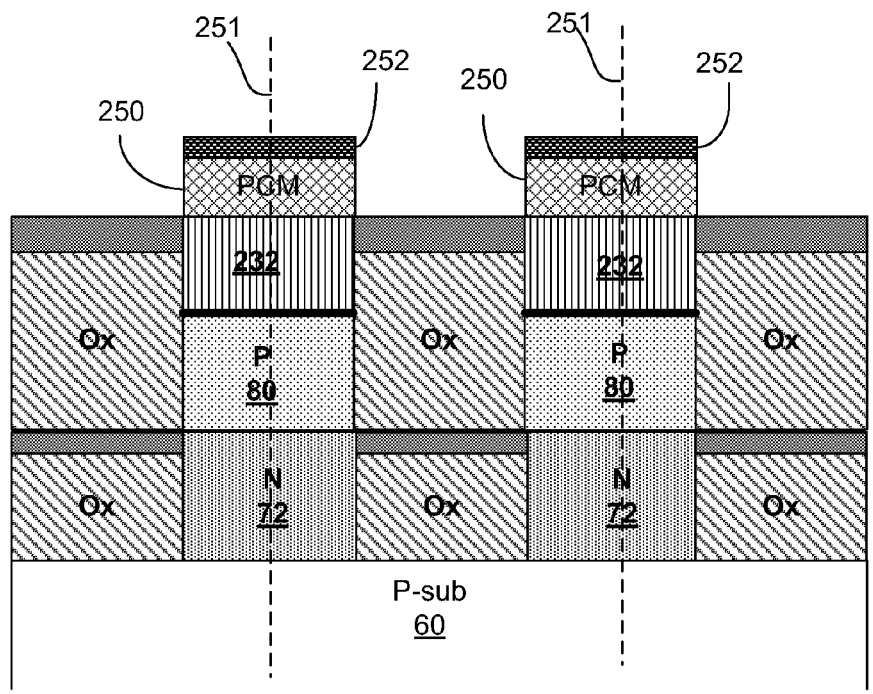

The PCM layer 246 and the top electrode layer 248 may then be patterned at block 214 to form PCM cells 250 and top electrodes 252 as depicted in FIG. 32. Viewed from above the substrate structure of FIG. 32, the PCM cells 250 and the top electrodes 252 may have a rectangular, a circular, or any other shape type. Note that the PCM cells 250 may be formed to be aligned with and directly on top of their respective block-type heating elements 232 and BJT structures 82 (e.g., emitter 80 and bases 72) unlike the previous case where the PCM cells 150 were offset from the ring-type heating elements 142 (see FIG. 22). That is, in this case, a PCM cell 250 may have the same center axis 251 as its respective block-type heating element 232 and its respective BJT structure 82 (i.e., the common center axis shared by the corresponding block-type heating element 232, emitter 80, and base 72). Such a stacked structure may result in a relatively small footprint on chip real estate. Thus, FIG. 32 illustrates two stacked PCM memory devices with block-type heating elements 232 in accordance with various embodiments.

Figure 33:
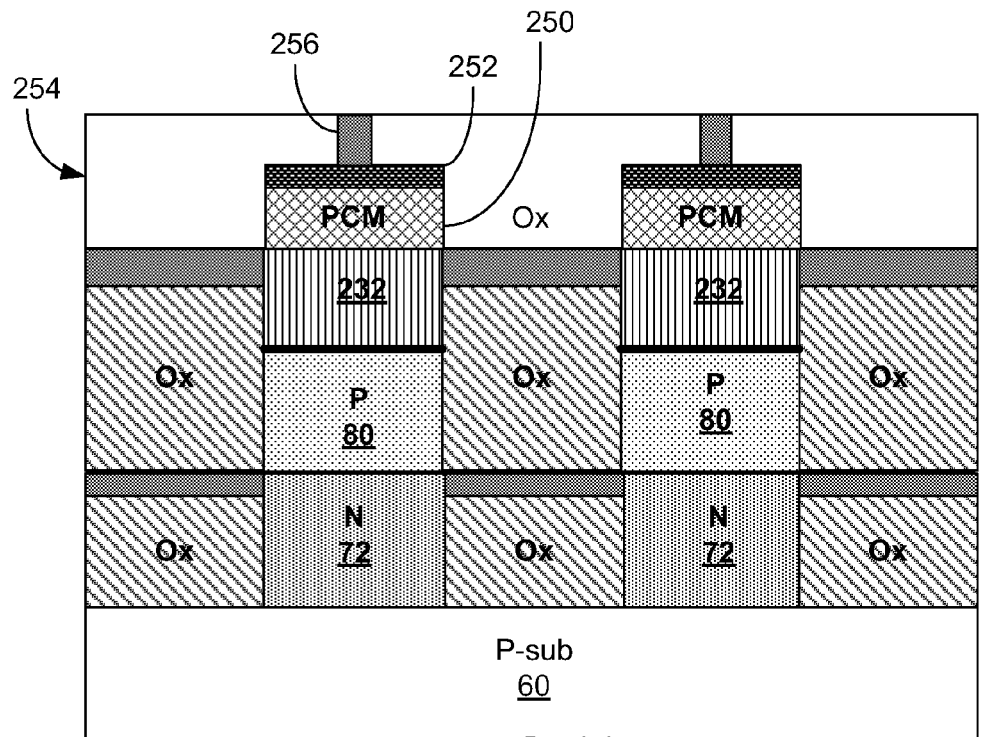
Figure 34:
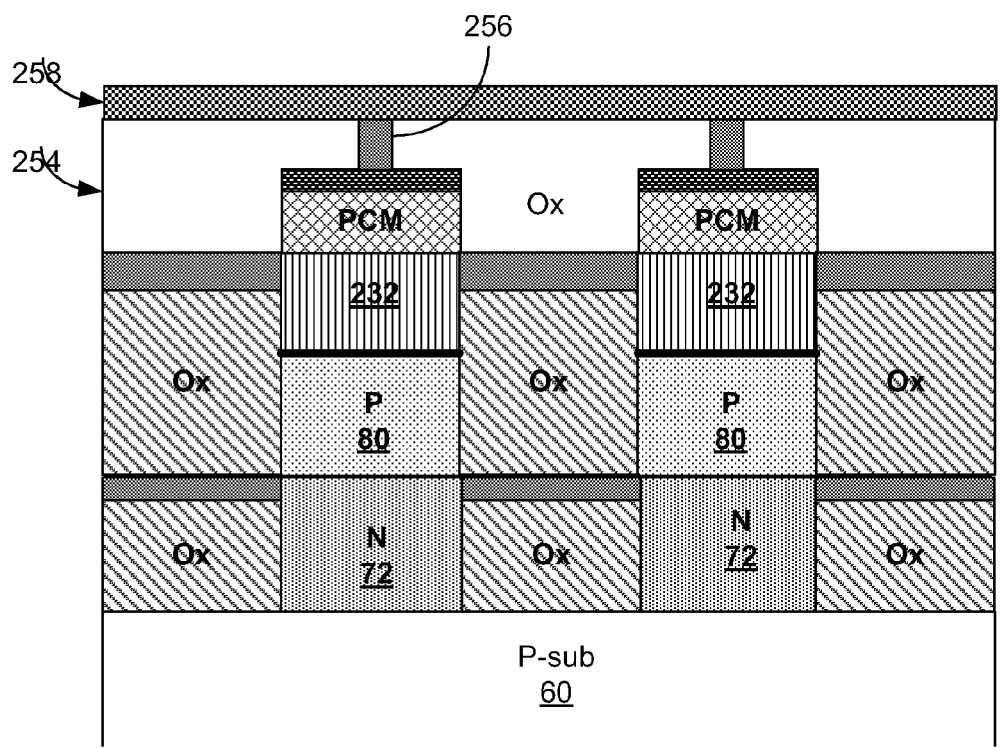

An oxide cap operation may further be performed at block 216 in order to deposit an oxide cap layer 254 over the top electrodes 252 and the PCM cells 250 as depicted in FIG. 33. A via formation operation may then be performed on the oxide cap layer 254 at block 218 in order to create vias 256 in the oxide cap layer 254 and on top of the top electrodes 252. A metal one (M1) layer deposition operation may then be performed at block 220 that results in an M1 layer 258 being deposited on the oxide cap layer 254 as depicted in FIG. 34. Finally, the M1 layer 258 may be patterned to form patterned M1 layer 260 as depicted in FIG. 35. In some embodiments, the patterned M1 layer 260 may be bit lines of a memory device.

Although specific embodiments have been illustrated and described herein, it will be appreciated by those of ordinary skill in the art and others, that a wide variety of alternate and/or equivalent implementations may be substituted for the specific embodiments illustrated and described without departing from the scope of the present invention. This application is intended to cover any adaptations or variations of the embodiments discussed herein. Therefore, it is manifested and intended that various embodiments of the invention be limited only by the claims and the equivalents thereof.

What is claimed is:

1. A method, comprising:
    forming a bipolar junction transistor (BJT) structure on a substrate, including creating a base of the BJT structure on the substrate and creating an emitter of the BJT structure on the base;
    forming a heating element on the emitter of the BJT structure such that a center axis of the heating element is substantially aligned with a center axis of the BJT structure, the center axis of the BJT structure being a common center axis of the emitter and the base of the BJT structure;
    forming a phase change material (PCM) cell on the heating element such that a center axis of the PCM cell is not aligned with the center axis of the heating element; and
    forming a bit line such that a center axis of the bit line is substantially aligned with the center axis of the PCM cell.

2. The method of claim 1, wherein said forming a BJT structure comprises forming the BJT structure within oxide layers.

3. The method of claim 2, wherein said forming the heating element comprises:
    etching back the emitter of the BJT to remove a portion of the emitter in order to form a void; and
    forming the heating element within the void.

4. The method of claim 3, further comprising forming an electrical contact on a surface of the etched back emitter within the void;
   wherein said forming the heating element includes forming the heating element on the electrical contact.

5. The method of claim 3, wherein said forming the heating element comprises:
   growing a spacer within the void;
   depositing heating element material on at least the grown spacer to form a ring-type heating element having a heating hole; and
   depositing an oxide to fill the heating hole with the oxide.

6. The method of claim 5, wherein the heating element material comprises at least one of TiN and TaN.

7. The method of claim 3, wherein said forming the heating element comprises:
   depositing a heating element material into the void to form a block-type heating element, the block-type heating element being without a hole.

8. The method of claim 7, wherein the heating element material comprises Tungsten.

9. The method of claim 1, further comprising: building an electrode on the PCM cell.

10. The method of claim 9, further comprising:
   depositing an oxide layer on the PCM cell and the electrode oxide layer; and
   forming a via in the oxide layer, the via being coupled to the electrode.

11. The method of claim 10, wherein said forming a bit line comprises:
   depositing an electrically conductive layer on the oxide layer and the via; and
   patterning the electrically conductive layer to form the bit line on at least the via.

12. The method of claim 1, wherein said forming a PCM cell comprises:
   creating an n-type base on the substrate; and
   creating a p-type emitter on the n-type base.

13. An apparatus, comprising:
   a bipolar junction transistor (BJT) structure having
      a base disposed on a substrate, and
      an emitter disposed on the base;
   a heating element disposed on the emitter such that a center axis of the heating element is substantially aligned with a center axis of the BJT structure, the center axis of the BJT structure being a common center axis of the emitter and the base of the BJT structure;
   a phase change material (PCM) cell disposed on the heating element such that a center axis of the PCM cell is not aligned with the center axis of the heating element; and
   a bit line electrically coupled to the PCM cell such that a center axis of the bit line is substantially aligned with the center axis of the PCM cell.

14. The apparatus of claim 13, wherein the heating element is a ring-type heating element comprising a heating hole filled with a dielectric material.

15. The apparatus of claim 13, wherein the base is an n-type base and the emitter is a p-type emitter.

16. The apparatus of claim 13, wherein the heating element comprises a material to generate heat when provided with an electrical current from the emitter.

17. The apparatus of claim 13, further comprising:
   an electrode disposed on the PCM cell; and
   a via structure disposed on the electrode, the via structure being configured to electrically couple the bit line to the PCM cell.

* * * * *